US011810910B2

(12) United States Patent
Wei et al.

(10) Patent No.: US 11,810,910 B2
(45) Date of Patent: Nov. 7, 2023

(54) GROUP III NITRIDE TRANSISTOR STRUCTURE CAPABLE OF REDUCING LEAKAGE CURRENT AND FABRICATING METHOD THEREOF

(71) Applicant: SUZHOU INSTITUTE OF NANO-TECH AND NANO-BIONICS (SINANO), CHINESE ACADEMY OF SCIENCES, Suzhou (CN)

(72) Inventors: Xing Wei, Suzhou (CN); Xiaodong Zhang, Suzhou (CN); Desheng Zhao, Suzhou (CN); Baoshun Zhang, Suzhou (CN)

(73) Assignee: SUZHOU INSTITUTE OF NANO-TECH AND NANO-BIONICS (SINANO), CHINESE ACADEMY OF SCIENCES, Suzhou (CN)

(*) Notice: Subject to any disclaimer, the term of this patent is extended or adjusted under 35 U.S.C. 154(b) by 0 days.

(21) Appl. No.: 18/012,240

(22) PCT Filed: Mar. 3, 2022

(86) PCT No.: PCT/CN2022/078927
§ 371 (c)(1),
(2) Date: Dec. 22, 2022

(87) PCT Pub. No.: WO2023/115701
PCT Pub. Date: Jun. 29, 2023

(65) Prior Publication Data
US 2023/0260988 A1 Aug. 17, 2023

(30) Foreign Application Priority Data

Dec. 22, 2021 (CN) .......................... 202111577242.3

(51) Int. Cl.
*H01L 27/06* (2006.01)
*H01L 29/778* (2006.01)
(Continued)

(52) U.S. Cl.
CPC ...... *H01L 27/0605* (2013.01); *H01L 21/8252* (2013.01); *H01L 29/2003* (2013.01);
(Continued)

(58) Field of Classification Search
None
See application file for complete search history.

(56) References Cited

U.S. PATENT DOCUMENTS

2011/0193171 A1* 8/2011 Yamagiwa ............ H01L 29/861
257/355
2014/0001515 A1* 1/2014 Kudymov ............ H01L 27/088
257/192
(Continued)

FOREIGN PATENT DOCUMENTS

CN 102203936 A 9/2011
CN 103730464 A 4/2014
(Continued)

OTHER PUBLICATIONS

Haiyu Zhang, et al., Loss Analysis During Dead Time and Thermal Study of Gallium Nitride Devices, IEEE, 2015, pp. 737-744.
(Continued)

*Primary Examiner* — Grant S Withers
(74) *Attorney, Agent, or Firm* — Bayramoglu Law Offices LLC

(57) ABSTRACT

A group III nitride transistor structure capable of reducing a leakage current and a fabricating method thereof are provided. The group III nitride transistor structure includes: a first heterojunction and a second heterojunction which are laminated, wherein the first heterojunction is electrically
(Continued)

isolated from the second heterojunction via a high resistance material and/or insertion layer; a first electrode, a second electrode and a first gate which are matched with the first heterojunction, wherein a third semiconductor is arranged between the first gate and the first heterojunction, and the first gate is also electrically connected with the first electrode; a source, a drain and a second gate which are matched with the second heterojunction, wherein the source and the drain are also respectively electrically connected with the first gate and the second electrode, and a sixth semiconductor is arranged between the second gate and the second heterojunction.

17 Claims, 9 Drawing Sheets

(51) Int. Cl.
| | | |
|---|---|---|
| H01L 29/66 | (2006.01) | |
| H01L 29/20 | (2006.01) | |
| H01L 21/8252 | (2006.01) | |
| H01L 29/872 | (2006.01) | |

(52) U.S. Cl.
CPC .. *H01L 29/66212* (2013.01); *H01L 29/66219* (2013.01); *H01L 29/66462* (2013.01); *H01L 29/7786* (2013.01); *H01L 29/7787* (2013.01); *H01L 29/872* (2013.01)

(56) References Cited

U.S. PATENT DOCUMENTS

| | | | |
|---|---|---|---|
| 2017/0098649 A1* | 4/2017 | Ohori | H01L 27/095 |
| 2018/0033682 A1* | 2/2018 | Chern | H01L 27/0605 |
| 2019/0280093 A1 | 9/2019 | Curatola et al. | |
| 2022/0384422 A1* | 12/2022 | Mukai | H01L 29/205 |
| 2022/0392887 A1* | 12/2022 | Yanagihara | H01L 29/861 |

FOREIGN PATENT DOCUMENTS

| | | |
|---|---|---|
| CN | 106206708 A | 12/2016 |
| CN | 106981513 A | 7/2017 |
| CN | 109216447 A | 1/2019 |
| JP | 2011151176 A | 8/2011 |

OTHER PUBLICATIONS

Hao Ronghui, Studies of Novel Normally-off p-GaN Gate HEMT Power Switching Devices, Ph.D. Dissertation Nanjing University of Science & Technology, 2019, pp. 1-118.

* cited by examiner

GROUP III NITRIDE TRANSISTOR STRUCTURE CAPABLE OF REDUCING LEAKAGE CURRENT AND FABRICATING METHOD THEREOF

CROSS REFERENCE TO THE RELATED APPLICATIONS

This application is the national phase entry of International Application No. PCT/CN2022/078927, filed on Mar. 3, 2022, which is based upon and claims priority to Chinese Patent Application No. 202111577242.3, filed on Dec. 22, 2021, the entire contents of which are incorporated herein by reference.

TECHNICAL FIELD

The present application relates to a transistor structure, particularly to a group III nitride transistor structure capable of reducing a leakage current and a fabricating method thereof, belonging to the technical field of semiconductors.

BACKGROUND

Group III nitrides (for example gallium nitride GaN) have excellent material features such as large band gap width, high breakdown field intensity, high electron mobility and high electron saturation drift velocity, and is considered as being extremely suitable for use in a next-generation power electronic system. Power electronic system transistor devices such as synchronous step-down or step-up converters will inevitably work in a reverse conduction state. For GaN-based high-electron-mobility transistors (HEMT), a reverse recovery speed is rapid due to the lack of a body diode, however, a voltage drop from a source to a drain depends on gate bias, which makes its value higher compared with that of Si-based and SiC-based power devices, and brings power consumption. Hence, improvement of reverse conduction capability of GaN HEMT is crucial to further reduction in power consumption of a GaN-based power electronic system.

At present, some methods have been reported, for example, in a GaN HEMT structure on Si, a Schottky diode (SBD) is fabricated by using substrate Si, the drain of HEMT is combined with a cathode of SBD, however, Si-based SBD cannot take the advantages of GaN due to limitation by material features, and even brings problems such as reliability, wherein, a crossed structure of HEMT and SBD or a transverse rectifier is effective, but it seems that the increase of the occupied area is an inevitable issue, and the voltage drop between the source and the drain required for reverse conduction depends on gate bias, and its value is relatively large to cause relatively high power consumption; transversely integrated SBD generally leads to increased leakage current, or increased forward conduction resistance of HEMT; vertically integrated SBD is uneasy to control through leakage current. It is currently reported that it is integrated with the Schottky diode on the substrate Si, so as not to take the advantages of GaN materials.

SUMMARY

The main objective of the present application is to provide a group III nitride transistor structure capable of reducing a leakage current and a fabricating method thereof, in order to overcome the defects in the prior art.

In order to achieve the objective of the present disclosure, the present application adopts the following technical solution:

One aspect of the embodiments of the present application provides a group III nitride transistor structure capable of reducing a leakage current, comprising:

a first heterojunction and a second heterojunction which are laminated, wherein the first heterojunction is electrically isolated from the second heterojunction via a high resistance material and/or insertion layer;

a first electrode, a second electrode and a first gate which are matched with the first heterojunction, wherein the first electrode is electrically connected with the second electrode via a first two-dimensional electron gas in the first heterojunction, and a third semiconductor is arranged between the first gate and the first heterojunction, the third semiconductor can exhaust a part of the first two-dimensional electron gas located below the third semiconductor, and the first gate is also electrically connected with a first electrode;

a source, a drain and a second gate which are matched with the second heterojunction, wherein the source is electrically connected with the drain via a second two-dimensional electron gas in the second heterojunction, and the source and the drain are also respectively electrically connected with the first gate and the second electrode, and a sixth semiconductor is arranged between the second gate and the second heterojunction, and the sixth semiconductor can exhaust a part of the second two-dimensional electron gas located below the sixth semiconductor.

The embodiments of the present application further provide a fabricating method of a group III nitride transistor structure capable of reducing a leakage current, comprising:

fabricating a first heterojunction, a high resistance material and/or insertion layer and a second heterojunction which are laminated in a set direction, wherein the first heterojunction is electrically isolated from the second heterojunction via the high resistance material and/or insertion layer;

fabricating a first electrode, a second electrode, a first gate and a third gate which are matched with the first heterojunction, wherein the first electrode is electrically connected with the second electrode through a first two-dimensional electron gas in the first heterojunction, the third semiconductor is arranged between the first gate and the first heterojunction, the first gate is also electrically connected with the first electrode, and the third semiconductor can exhaust a part of the first two-dimensional electron gas located below the third semiconductor;

fabricating a source, a drain, a second gate and a sixth semiconductor which are matched with the second heterojunction, wherein the source is electrically connected with the drain through a second two-dimensional electron gas in the second heterojunction, the sixth semiconductor is arranged between the second gate and the second heterojunction, and the sixth semiconductor can exhaust a part of the second two-dimensional electron gas located below the sixth semiconductor; and electrically connecting the first gate with the source, and electrically connecting the second electrode with the drain.

Compared with the prior art, the present application has the advantages:

1) in the group III nitride transistor structure capable of reducing the leakage current provided by the embodiments of the present application, a diode and a triode are integrated in a direction vertical to a substrate, so that the area of a wafer occupied by the group III nitride transistor is smaller, which is conducive to miniaturization application of a device;
2) in the group III nitride transistor structure capable of reducing the leakage current provided by the embodiments of the present application, the entire structure of the device has the characteristics of direct growth, process compatibility and the like, thereby effectively reducing the complexity and preparation cost of the device;
3) the group III nitride transistor structure capable of reducing the leakage current provided by the embodiments of the present application can effectively reduce the leakage current and power consumption of the device, thereby improving the reliability and stability of the device;
4) the group III nitride transistor structure capable of reducing the leakage current provided by the embodiments of the present application is better in process compatibility and more convenient in design.

DETAILED DESCRIPTION OF THE EMBODIMENTS

Figure 1A:
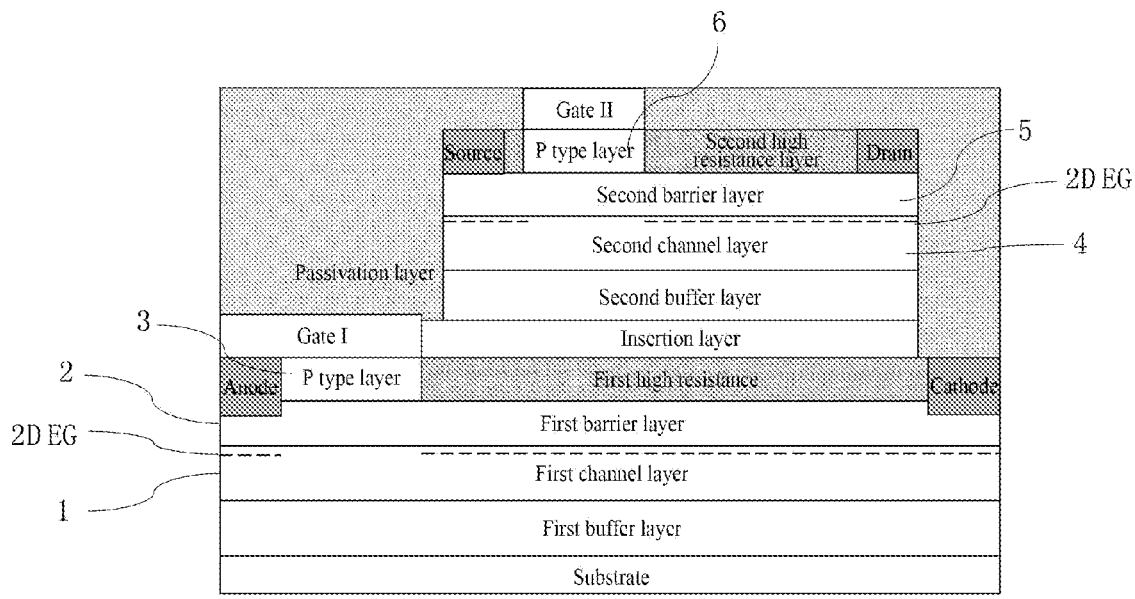
FIG. 1A is a structural diagram of a group III nitride transistor structure capable of reducing a leakage current provided in example 1 of the present application.
Figure 1B:
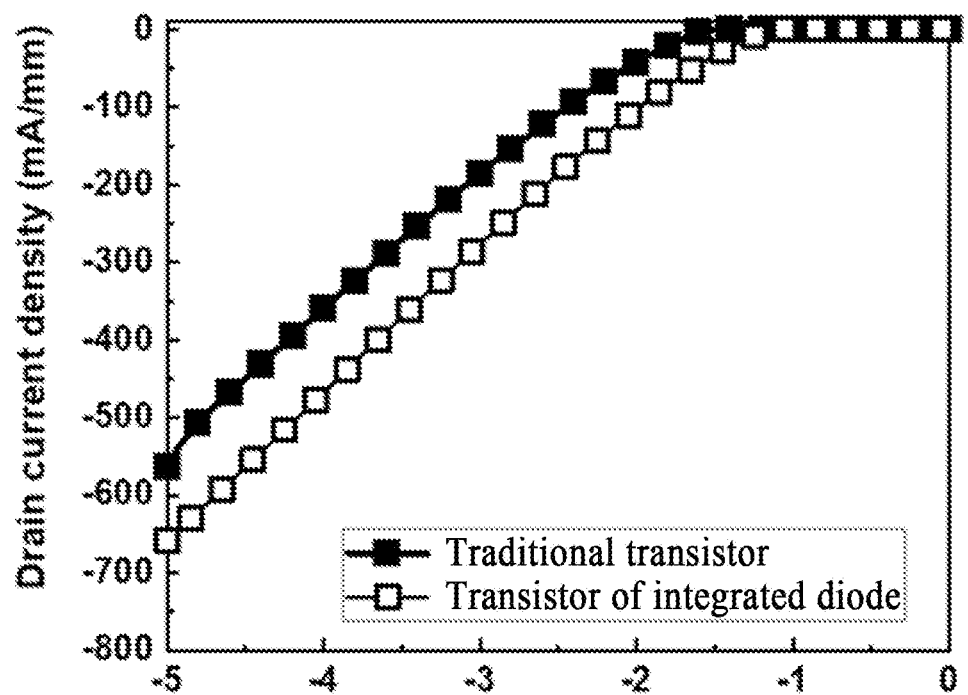
FIG. 1B is a TCAD simulation test results of a group III nitride transistor structure capable of reducing a leakage current provided in example 1 of the present application.

In view of the defects in the prior art, the inventors of this case put forward the technical solution of the present application through long-term researches and lots of practices. Next, the technical solution, its implementation process, principle and the like will be further explained and described.

The embodiments of the present application provide a group III nitride transistor structure capable of reducing leakage current. To improve the conduction feature of the transistor structure and reduce the reverse conduction voltage drop of the transistor structure, the embodiments of the present application provide a device structure where a transistor is connected with a diode in parallel; to reduce the area of the wafer occupied by the device, transistors and diodes are vertically piled in the embodiments of the present application to achieve vertical integration, avoiding the area increase in a transverse direction; and to avoid the increase in leakage current, the embodiments of the present application adopt a mixed anode diode structure that is similar to the HEMT device structure and compatible to the process, this diode has an in-situ high resistance passivation layer (which can be understood as a high resistance material), thereby greatly reducing the leakage current of the device surface; in addition, to take the advantages of the GaN device, the embodiments of the present application adopt the mixed anode diode structure that is similar to the HEMT device structure and is compatible to the process, and this diode, as a transverse rectifier device, uses a GaN material and a AlGaN/GaN heterojunction as a basic structure as well.

In the embodiments of the present application, the electric isolation of the first heterojunction from the second heterojunction is achieved via the high resistance material and/or insertion layer, and this insertion layer can also reduce stress, the inventor of this case find that it is difficult to achieve vertical integration for material epitaxy, because the thickness of the material structure requiring epitaxy is thick enough, but the thick epitaxial material structure leads to phenomena such as cracking of a sample, and arrangement of the insertion layer between the first heterojunction and the second heterojunction can effectively alleviate the cracking of the sample.

One aspect of the embodiments of the present application provides a group III nitride transistor structure capable of reducing a leakage current, comprising:
  a first heterojunction and a second heterojunction which are laminated, wherein the first heterojunction is electrically isolated from the second heterojunction via a high resistance material and/or insertion layer;
  a first electrode, a second electrode and a first gate which are matched with the first heterojunction, wherein the first electrode is electrically connected with the second electrode via a first two-dimensional electron gas in the first heterojunction, and a third semiconductor is arranged between the first gate and the first heterojunction, the third semiconductor can exhaust a part of the first two-dimensional electron gas located below the third semiconductor, and the first gate is also electrically connected with a first electrode;
  a source, a drain and a second gate which are matched with the second heterojunction, wherein the source is electrically connected with the drain via a second two-dimensional electron gas in the second heterojunction, and the source and the drain are also electrically connected with the first gate and the second electrode respectively, and a sixth semiconductor is arranged between the second gate and the second heterojunction, and the sixth semiconductor can exhaust a part of the second two-dimensional electron gas located below the sixth semiconductor.

In a specific embodiment, the group III nitride transistor structure comprises a first semiconductor, a second semiconductor, a high resistance material layer or insertion layer, a fourth semiconductor and a fifth semiconductor which successively grow in a set direction, or the group III nitride transistor structure comprises a fourth semiconductor, a fifth semiconductor, a high resistance material layer or insertion layer, a first semiconductor and a second semiconductor which successively grow in a set direction; or, the group III nitride transistor structure comprises a first semiconductor, a second semiconductor, a high resistance material layer, an insertion layer, a fourth semiconductor and a fifth semiconductor which successively grow in a set direction, or the group III nitride transistor structure comprises a fourth semiconductor, a fifth semiconductor, a high resistance material layer, an insertion layer, a first semiconductor and a second semiconductor which successively grow in a set direction;

wherein, the first semiconductor is matched with the second semiconductor to form a first heterojunction, and the fourth semiconductor is matched with the fifth semiconductor to form a second heterojunction.

In a specific embodiment, the high resistance material layer is formed by transforming a first region of a continuous third semiconductor layer, and the third semiconductor is distributed in a second region of the third semiconductor layer;

or, the third semiconductor is formed by transforming a second region of a continuous high resistance material layer, and the high resistance material is distributed in a first region of the high resistance material layer.

In a specific embodiment, the semiconductor is a p-type semiconductor.

In a specific embodiment, the material of the third semiconductor comprises a p-type wide band gap semiconductor.

In a specific embodiment, the p-type wide band gap semiconductor comprises a p-type group III nitride.

In a specific embodiment, the p-type group III nitride comprises p-type GaN, p-type AlGaN, p-type InGaN or p-type InN.

In a specific embodiment, the p-type semiconductor comprises p-type polycrystalline silicon, p-type non-crystalline silicon, a p-type oxide, p-type diamond or a p-type semiconductor polymer.

In a specific embodiment, the third semiconductor comprises a plurality of strip-shaped p-type semiconductors arranged at intervals, and the plurality of strip-shaped p-type semiconductors are distributed in an array.

In a specific embodiment, the doping concentration of the third semiconductor is $10^{16}$-$10^{20}$ cm$^{-3}$.

In a specific embodiment, the thickness of the third semiconductor is 10 nm-500 nm.

In a specific embodiment, the high resistance material comprises high resistance GaN, high resistance AlGaN, high resistance $Ga_2O_3$, high resistance InGaN or high resistance InN.

In a specific embodiment, the high resistance material layer is formed by transforming a third region of a continuous sixth semiconductor layer, and the sixth semiconductor is distributed in a fourth region of the sixth semiconductor layer.

or, the sixth semiconductor is formed by transforming a fourth region of a continuous high resistance material layer, and the high resistance material is distributed in the third region of the high resistance material layer.

In a specific embodiment, the sixth semiconductor is the p-type semiconductor.

In a specific embodiment, the material of the sixth semiconductor comprises a p-type wide band gap semiconductor.

In a specific embodiment, the p-type wide band gap semiconductor comprises a p-type group III nitride.

In a specific embodiment, the p-type group III nitride comprises p-type GaN, p-type AlGaN, p-type InGaN or p-type InN.

In a specific embodiment, the p-type semiconductor comprises p-type polycrystalline silicon, p-type non-crystalline silicon, a p-type oxide, p-type diamond or a p-type semiconductor polymer.

In a specific embodiment, the high resistance material comprises high resistance GaN, high resistance AlGaN, high resistance $Ga_2O_3$, high resistance InGaN or high resistance InN.

In a specific embodiment, the high resistance material layer is distributed between the third semiconductor and the second electrode, and the third semiconductor is also electrically isolated from the second electrode via the high resistance material;

or, the high resistance material layer is distributed between the sixth semiconductor and the source as well as the drain, and the sixth semiconductor is also electrically isolated from the source and the drain via the high resistance material.

In a specific embodiment, the insertion layer comprises any one of a metal layer, a dielectric layer and a two-dimensional material layer.

In a specific embodiment, the metal layer comprises a single-layer metal layer or a laminated multi-layer metal layer, and the material of the metal layer comprises any one of Mo, Mg and Al, but is not limited thereto.

In a specific embodiment, the thickness of the metal layer is 2 nm-10 μm.

In a specific embodiment, the material of the dielectric layer comprises any one of AlN, BN, AlBN, AlPN, BCN, high resistance AlGaN and high resistance GaN, but is not limited thereto.

In a specific embodiment, the thickness of the dielectric layer is 0.5 nm-1 μm.

In a specific embodiment, the material of the two-dimensional material layer comprises any one of BN, graphene, fluorinated graphene, graphene oxide and black phosphorus, but is not limited thereto.

In a specific embodiment, the thickness of the two-dimensional material layer is 0.5 nm-500 nm.

In a specific embodiment, the second heterojunction is also provided with an insulating dielectric layer, and the source and the drain are arranged on the insulating dielectric layer.

In a specific embodiment, the thickness of the insulating dielectric layer is 1-1000 nm.

In a specific embodiment, the material of the insulating dielectric layer comprises a combination of any one or more than two of $SiO_2$, AlN and $Si_3N_4$, but is not limited thereto.

In a specific embodiment, the sixth semiconductor is also provided with a two-dimensional material, and the source and the drain are arranged on the two-dimensional material.

In a specific embodiment, the third semiconductor is provided with the two-dimensional material.

In a specific embodiment, the layer number of the two-dimensional material is 1-100 layers.

In a specific embodiment, the two-dimensional material is a single kind of two-dimensional material or two-dimensional material heterojunction.

In a specific embodiment, the two-dimensional material comprises a combination of any one or more than two of graphene, $MoS_2$ and $WS_2$, but is not limited thereto.

In a specific embodiment, a seventh semiconductor is also arranged between the first semiconductor and the second semiconductor and/or between the fourth semiconductor and the fifth semiconductor.

In a specific embodiment, the materials of the first semiconductor, the second semiconductor, the fourth semiconductor and the fifth semiconductor are all selected from group III-V compounds.

In a specific embodiment, the materials of the first semiconductor and the fourth semiconductor comprise GaN or GaAs, but are not limited thereto.

In a specific embodiment, the materials of the second semiconductor and the fifth semiconductor comprise AlGaN or AlGaAs, but are not limited thereto.

In a specific embodiment, the material of the seventh semiconductor comprises AN, but is not limited thereto.

In a specific embodiment, the first heterojunction is matched with the first electrode and the second electrode to form a diode, the second heterojunction is matched with the source, the drain and the gate to form a transistor (which can also be understood as a triode, the same below), the first electrode can be an anode, and the second electrode can be a cathode.

In a specific embodiment, a lower p-type doping concentration and/or a thinner p-type material thickness can be set in the third semiconductor to weaken its control on 2 DEG channel I, thereby reducing the conduction voltage drop of the diode. After the conduction voltage drop of the diode is reduced, the diode is preferentially conducted when the transistor is reversely conducted, that is, the first channel formed by the first two-dimensional electron gas in the first heterojunction is firstly conducted, and therefore the voltage drop of the reverse conducted source and drain of the transistor is reduced.

In a specific embodiment, the electric connection between the first electrode and the source can be interconnection via metal on a chip, or connection via metal in an external circuit; the electric connection between the second electrode and the drain can be interconnection via metal on a chip, or connection via metal in an external circuit.

In a specific embodiment, the thickness of the gate is 10-1000 nm, the material of the gate can be a combination of any one or more than two of Ti, Al, Ni, Au, Cr, Pt, Mo and Pd, which for example can be selected from the group consisting of: Ni/Au, Mo/Au, Cr/Au and Pd/Au, but is not limited thereto; the thickness of the first electrode, the second electrode, the source and the drain can be 10-1000 nm, and the materials of the first electrode, the second electrode, the source and the drain can be alloys formed by any one or more than two of Au, Cr, Pt, Ag, Ti, Al and TiN, which for example can be selected from the group consisting of: Ti/Al/Ni/Au, Ti/Al/Ti/Au and Ti/Al/Ti/TiN, but is not limited thereto.

In a specific embodiment, the first heterojunction or the second heterojunction is formed on a substrate, and a buffer layer is also distributed between the first heterojunction or second heterojunction and the substrate.

It is noted that, the transistor can be stacked on the diode in a vertical direction, or, the diode is stacked on the transistor in the vertical direction, and their relative positions on the vertical direction can be interchanged.

The embodiments of the present application further provide a fabricating method of a group III nitride transistor structure capable of reducing a leakage current, comprising:

fabricating a first heterojunction, a high resistance material and/or insertion layer and a second heterojunction which are laminated in a set direction, wherein the first heterojunction is electrically isolated from the second heterojunction via the high resistance material and/or insertion layer;

fabricating a first electrode, a second electrode, a first gate and a third gate which are matched with the first heterojunction, wherein the first electrode is electrically connected with the second electrode through a first two-dimensional electron gas in the first heterojunction, the third semiconductor is arranged between the first gate and the first heterojunction, the first gate is also electrically connected with the first electrode, and the third semiconductor can exhaust a part of the first two-dimensional electron gas located below the third semiconductor;

fabricating a source, a drain, a second gate and a sixth semiconductor which are matched with the second heterojunction, wherein the source is electrically connected with the drain through a second two-dimensional electron gas in the second heterojunction, the sixth semiconductor is arranged between the second gate and the second heterojunction, and the sixth semiconductor can exhaust a part of the second two-dimensional electron gas located below the sixth semiconductor; and electrically connecting the first gate with the source, and electrically connecting the second electrode with the drain.

In a specific embodiment, the fabricating method specifically comprises:

successively growing a first semiconductor, a second semiconductor, a high resistance material layer or insertion layer, a fourth semiconductor and a fifth semiconductor which are laminated in a set direction, or, successively growing a fourth semiconductor, a fifth semiconductor, a high resistance material layer or insertion layer, a first semiconductor and a second semiconductor which are laminated in a set direction, or, successively growing a first semiconductor, a second semiconductor, a high resistance material layer, an insertion layer, a fourth semiconductor and a fifth semiconductor which are laminated in a set direction, or, successively growing a fourth semiconductor, a fifth semiconductor, a high resistance material layer, an insertion layer, a first semiconductor and a second semiconductor which are laminated in a set direction, wherein, the first semiconductor is matched with the second semiconductor to form a first heterojunction, and the fourth semiconductor is matched with the fifth semiconductor to form a second heterojunction.

In a specific embodiment, the fabricating method specifically comprises:

forming a continuous third semiconductor layer on the second semiconductor, wherein the third semiconductor layer comprises a first region and a second region, and transforming the first region to form the high resistance material layer; or, forming a continuous high resistance material layer on the second semiconductor, wherein the high resistance material layer comprises a first region and a second region, and transforming the second region to form the third semiconductor.

In a specific embodiment, the fabricating method specifically comprises:

forming a continuous sixth semiconductor layer on the fifth semiconductor, wherein the sixth semiconductor layer comprises a third region and a fourth region, and transforming the third region to form the high resistance material layer;

or, forming a continuous high resistance material layer on the fifth semiconductor, wherein the high resistance material layer comprises a third region and a fourth region, and transforming the fourth region to form the sixth semiconductor.

In a specific embodiment, the method for transformation comprises a combination of any one or more of H ion injection, H plasma treatment, H doping and annealing, N ion injection, F ion injection, Ar ion injection, Fe ion injection, O plasma treatment and thermal oxidization.

For example, the third semiconductor and the sixth semiconductor are generally made of a p-GaN material and can be subjected to in-situ passivation through selective activation or $NH_3$ annealing, H plasma treatment, H ion injection, O plasma treatment, thermal oxidization, secondary epitaxy, ion injection and other manners, and the in-situ passivation method is selective passivation to impair its control on 2 DEG and reduce the conduction voltage drop of the diode.

Of course, the third semiconductor and the sixth semiconductor can also be made of p-type materials such as p-type polycrystalline silicon and p-type oxides, these materials are deposited by sputtering, low pressure chemical vapor deposition (LPCVD), plasma enhanced chemical vapor deposition (PECVD) and other manners, their concentrations can be controlled through deposition conditions, or subsequently regulated through ion injection, annealing and other means, so as to regulate the voltage drop of the diode.

In is noted that, the p-type semiconductor (third semiconductor) under the second portion of the first electrode is patterned, then partially subjected to in-situ passivation through $NH_3$ annealing, H plasma treatment, H ion injection, O plasma treatment, thermal oxidization and the like, or partially removed by dry etching (inductively coupled plasma (ICP), reactive ion etching (RIE), neutral loop discharge (NLD), etc.) or wet etching (photoelectrochemical (PEC) etching, KOH, etc.), so as to adjust the concentration of channel electrons under the p-type semiconductor and then regulate the voltage drop of the diode.

In a specific embodiment, the third semiconductor can be subjected to in-situ passivation through $NH_3$ annealing, H plasma treatment, H ion injection, O plasma treatment, thermal oxidization and the like to reduce the leakage current; the sixth semiconductor can be subjected to selective activation by a post-process annealing activation manner so that only the sixth semiconductor under the second gate is remained, and the rest is in an inactivated state, that is, a high resistance region, so as to reduce the leakage current.

In a specific embodiment, the fabricating method further comprises: patterning the third semiconductor, thereby processing the third semiconductor into a strip-shaped array structure.

In a specific embodiment, the fabricating method further comprises:
  performing epitaxial growth of the third semiconductor and the high resistance material layer in the selected region of the second semiconductor;
  or, performing epitaxial growth of the sixth semiconductor and the high resistance material layer in the selected region of the fifth semiconductor.

In a specific embodiment, the fabricating method further comprises: forming an insertion layer on the high resistance material layer, and then fabricating a first heterojunciton or a second heterojunction on the insertion layer.

In a specific embodiment, the insertion layer comprises any one of a metal layer, a dielectric layer and a two-dimensional material layer.

In a specific embodiment, the metal layer comprises a single-layer metal layer or a laminated multi-layer metal layer, and the material of the metal layer comprises any one of Mo, Mg and Al, but is not limited thereto.

In a specific embodiment, the thickness of the metal layer is 2 nm-10 μm.

In a specific embodiment, the material of the dielectric layer comprises any one of AlN, BN, AlBN, AlPN, BCN, high resistance AlGaN and high resistance GaN, but is not limited thereto.

In a specific embodiment, the thickness of the dielectric layer is 0.5 nm-1 μm.

In a specific embodiment, the material of the two-dimensional material layer comprises any one of BN, graphene, fluorinated graphene, graphene oxide and black phosphorus, but is not limited thereto.

In a specific embodiment, the thickness of the two-dimensional material layer is 0.5 nm-500 nm.

In a specific embodiment, the third semiconductor is also electrically isolated from the second electrode via the high resistance material, or, the sixth semiconductor is electrically isolated from the source and the drain via the high resistance material.

In a specific embodiment, the third semiconductor and the sixth semiconductor are p-type semiconductors.

In a specific embodiment, the materials of the third semiconductor and the sixth semiconductor comprise p-type wide band gap semiconductors.

In a specific embodiment, the p-type wide band gap semiconductor comprises a p-type group III nitride.

In a specific embodiment, the p-type group III nitride comprises p-type GaN, p-type AlGaN, p-type InGaN or p-type InN.

In a specific embodiment, the p-type semiconductor comprises p-type polycrystalline silicon, p-type non-crystalline silicon, a p-type oxide, p-type diamond or a p-type semiconductor polymer.

In a specific embodiment, the first high resistance material and the second high resistance comprise high resistance GaN, high AlGaN, high resistance $Ga_2O_3$, high resistance InGaN or high resistance InN.

It is noted that, the transistor portion and the diode portion in the group III nitride transistor capable of reducing leakage current provided by the embodiments of the present application can be fabricated on the same wafer, or respectively fabricated on different wafers, then the diode portion and the transistor portion are integrated in the vertical direction through bonding; wherein, the p-type semiconductor of the upper-layer device portion in the vertical direction can be entirely activated, and then selectively retained by etching or passivation; of course, the p-type semiconductor can be obtained by selective epitaxy or transverse epitaxy.

Next, this technical solution, its implementation process and principle will be further explained and illustrated in combination with drawings and specific embodiments, unless otherwise specified, deposition, epitaxy, etching and other processes adopted in embodiments of the present application are all known by those skilled in the art.

Example 1

Referring to FIG. 1A, a group III nitride transistor structure can comprise:

a first buffer layer, a first channel layer (i.e., the above-mentioned semiconductor, the same below) 1, a first barrier layer (i.e., the above-mentioned second semiconductor, the same below) 2, a first p-type layer (i.e., the above-mentioned third semiconductor, the same below) 3 and a first high resistance layer (i.e., a first high resistance material or a first high resistance material layer, the same below), an insertion layer (of course, the insertion layer cannot be arranged), a second buffer layer, a second channel layer (i.e., the above-mentioned fourth semiconductor, the same below) 4, a second barrier layer (i.e., the above-mentioned fifth semiconductor, the same below) 5, a second p-type layer (i.e., the above-mentioned sixth semiconductor, the same below) 6 and a second high resistance layer (i.e., a second high resistance material or a second high resistance material layer, the same below) which are successively laminated in a substrate, the first channel layer 1 is matched with the first barrier layer 2 to form a first heterojunction, and a first two-dimensional electron gas (2 DEG) is formed between the first channel layer 1 and the first barrier layer 2, and the second channel layer 4 and the second barrier layer 5 are matched to form a second heterojunction, and a second two-dimensional electron gas (2 DEG) is formed between the second channel layer 4 and the second barrier layer 5;

the first barrier layer 2 is provided with anodes (i.e., the above-mentioned first electrode, the same below) and cathodes (i.e., the above-mentioned second electrode, the same below) at intervals, the cathode is electrically connected with the anode via first 2 DEG, the first p-type layer is also provided with a first gate (i.e., gate I in the figure, the same below), the first gate is electrically connected with the anode and completely covers the first p-type layer, the first gate electrically contacts with the first p-type layer, and the first p-type layer is electrically isolated from the cathode via the first high resistance layer;

the second barrier layer 5 is provided with the sources and the drains at intervals, the source is electrically connected with the drain via the second 2 DEG, the second p-type layer is provided with a second gate (gate II in the figure), and the second p-type is electrically isolated from the source and the drain via the second high resistance layer; and the first heterojunction is electrically isolated from the second heterojunction via the first high resistance layer and the insertion layer, the first gate is also electrically connected with the source, and the cathode is also electrically connected with the drain.

It is noted that, the first heterojunction is matched with the anode, the cathode and the first gate to form a diode, the second heterojunction is matched with the source, the drain and the second gate to form a transistor, and the surface of the structure of the group III nitride transistor is also covered with a passivation layer.

Specifically, the insertion layer can be any one of a metal layer, a dielectric layer and a two-dimensional material layer, the metal layer comprises a single-layer metal layer or a laminated multi-layer metal layer, the material of the metal layer comprises any one of Mo, Mg and Al, and the thickness of the metal layer is 2 nm-10 μm.

Specifically, the metal Mg layer can be subjected to heat annealing in a nitrogen environment so that it is alloyed with a lower-layer material, the temperature of heat annealing can be 400-800° C., the time of heat annealing can be 5-120 min; the metal Al layer can be subjected to heat annealing in an oxygen environment so that it is oxidized, the temperature can be room temperature to 800° C., and the time can be 5-120 min. Of course, the metal Al can be subsequently continued to undergo plasma treatment which adopts $N_2$, $N_2O$, $NH_3$, NO and other plasmas, and a device can be ICP, RIE, PECVD or the like. The metal Al layer can also be continued to undergo UV ozone treatment, and the time for UV ozone treatment is 30 min-300 min, wherein the metal of the insertion layer can be used as a back electrode, and wide uses include voltage application and temperature detection. Laminated metal (such as Mg/Mo/Mg) can also be adopted to improve the heat dissipation capability of the device.

Specifically, the material of the dielectric layer comprises any one of AlN, BN, AlBN, AiPN, BCN, high resistance AlGaN and high resistance GaN, the thickness of the dielectric layer is 0.5 nm-1 μm; the material of the two-dimensional material layer comprises any one of BN, graphene, fluorinated graphene, oxidized graphene and black phosphorus, and the thickness of the two-dimensional material layer is 0.5 nm-500 nm.

Figure 2A:
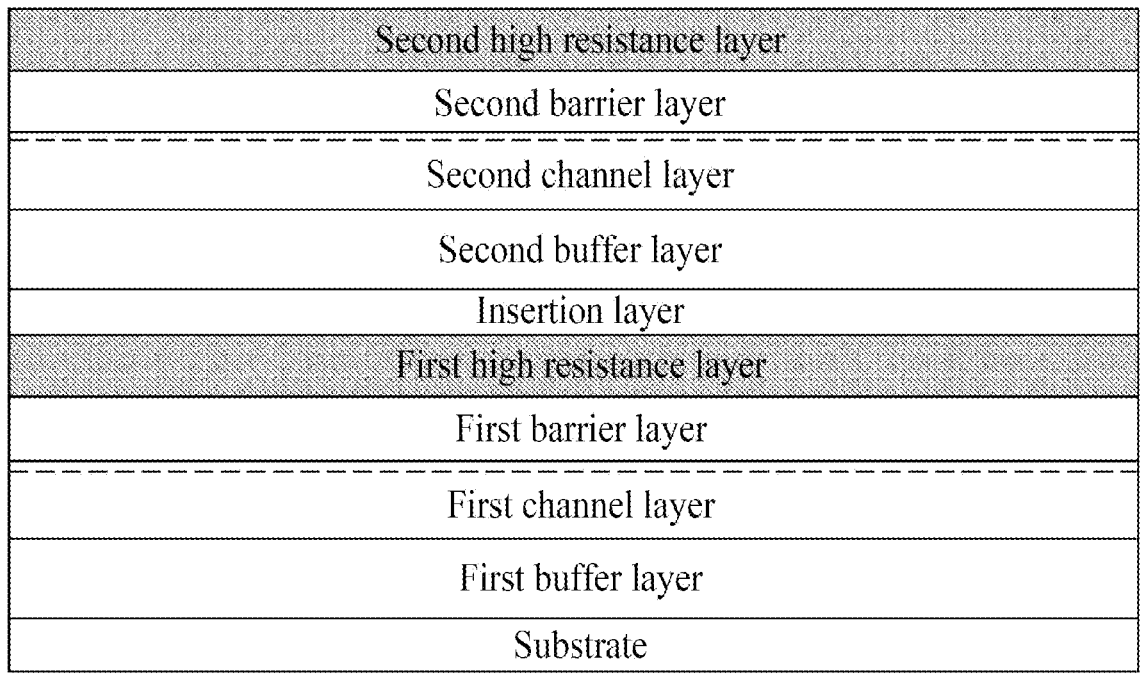
FIG. 2A-FIG. 2G are fabricating flowcharts of a group III nitride transistor structure capable of reducing a leakage current provided in example 1 of the present application.
Figure 2B:
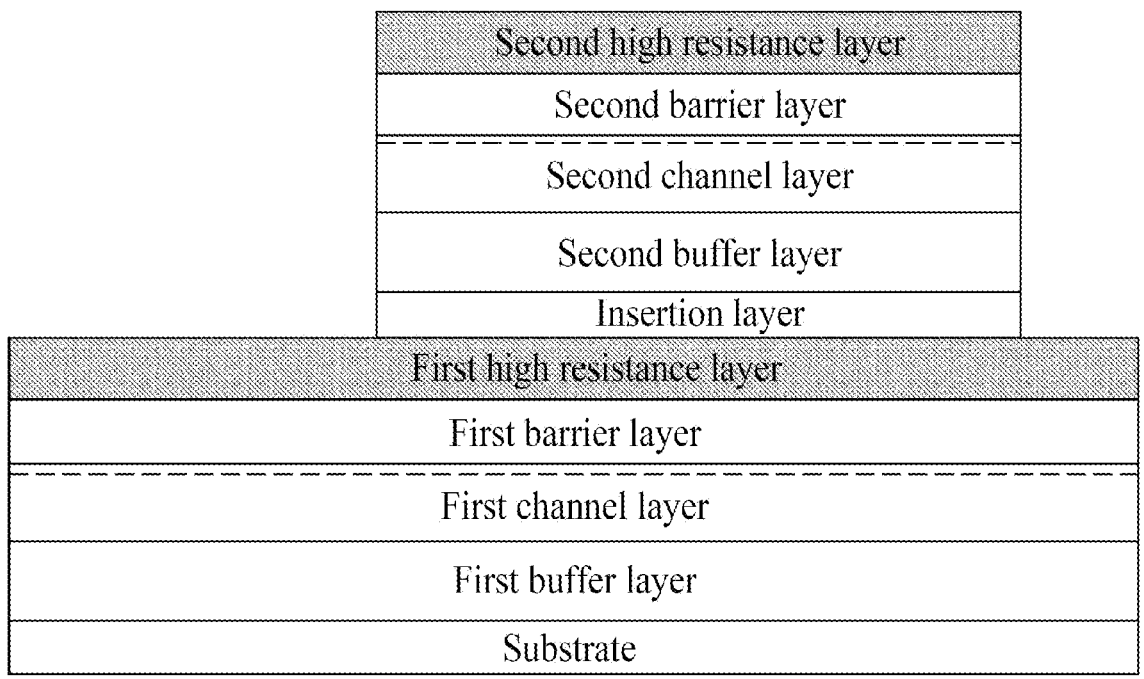
Figure 2C:
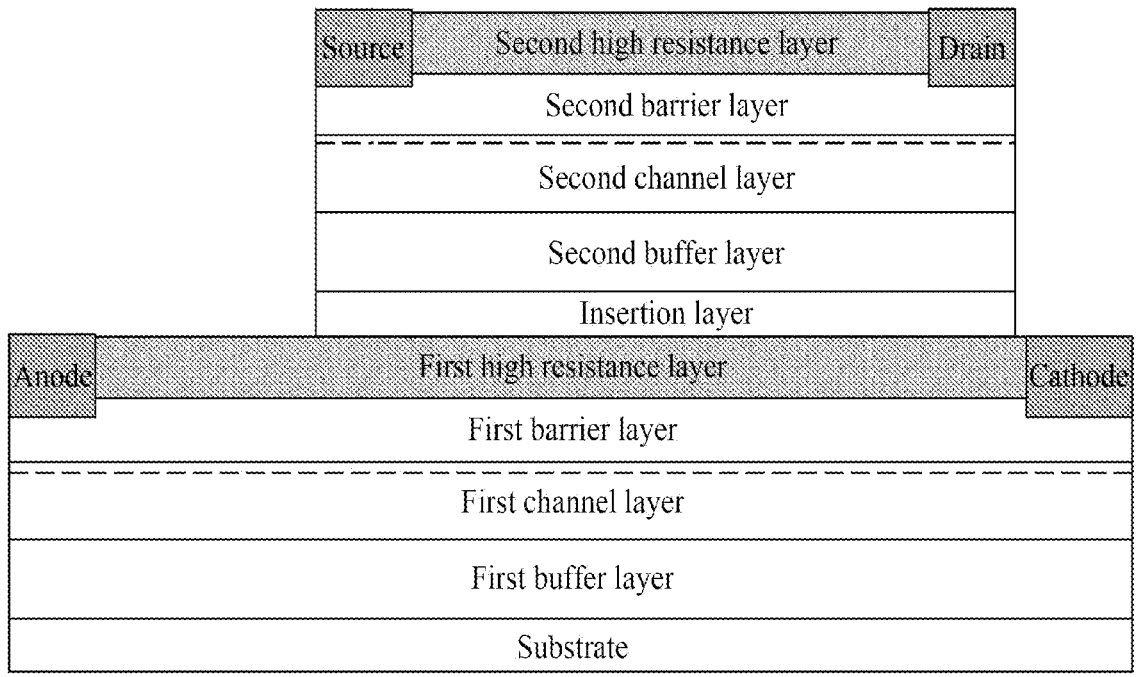
Figure 2D:
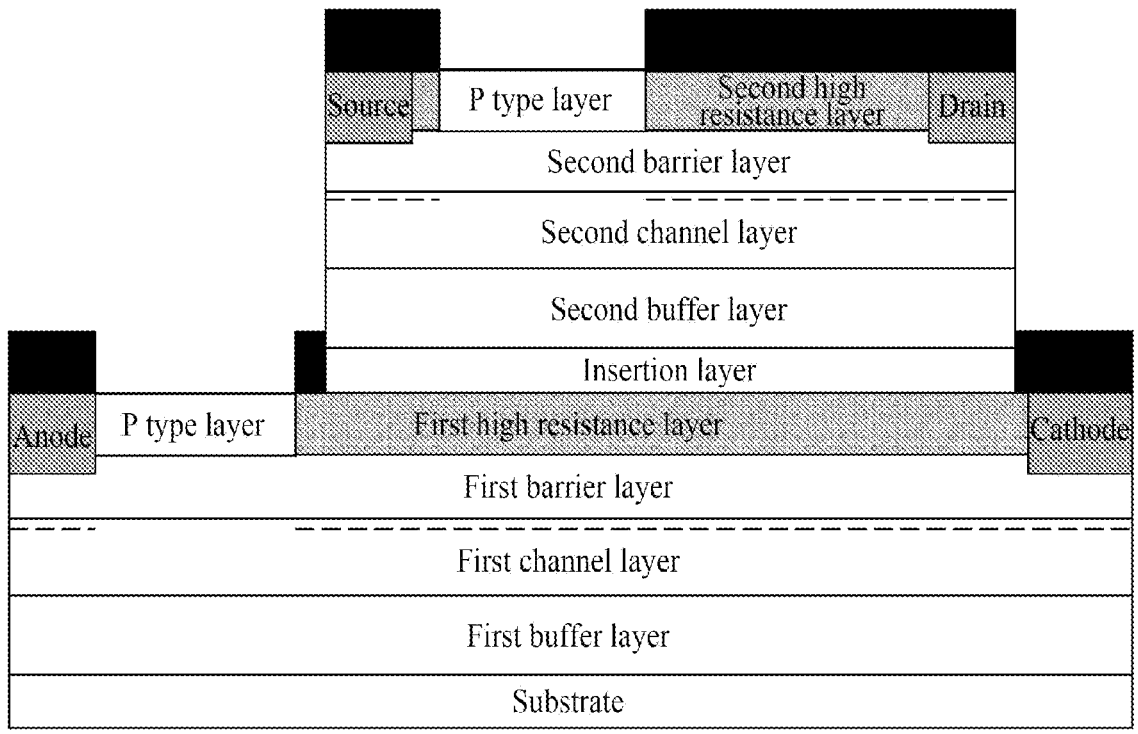
Figure 2E:
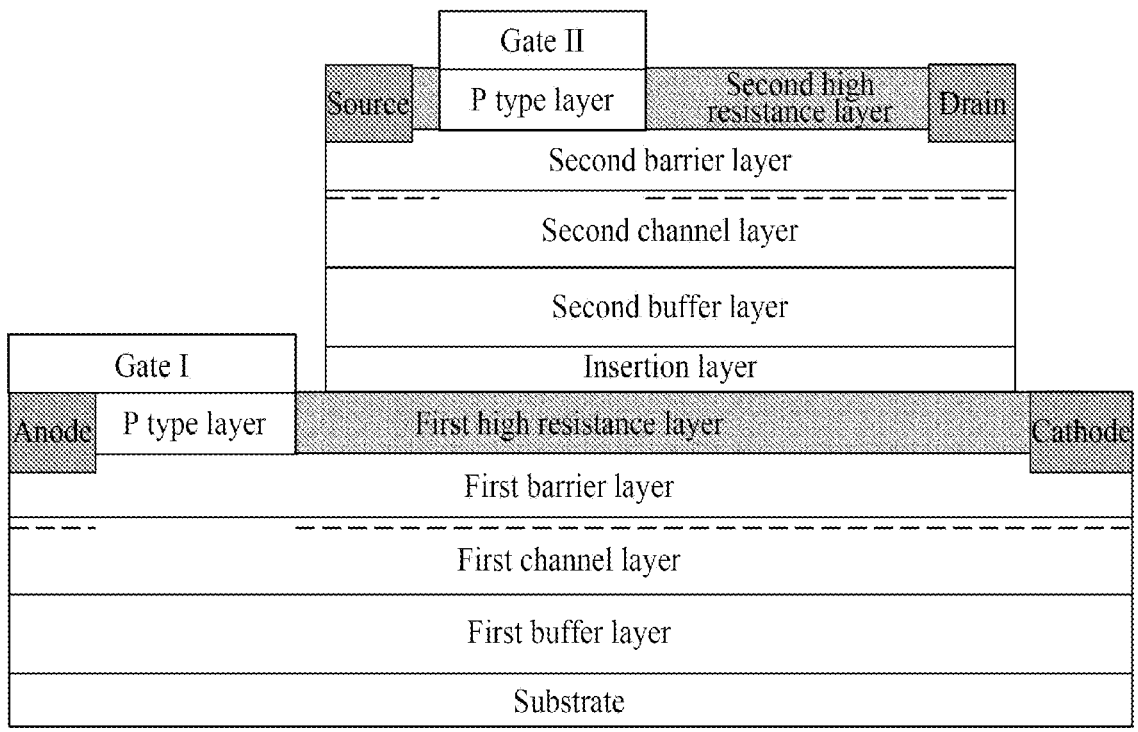
Figure 2F:
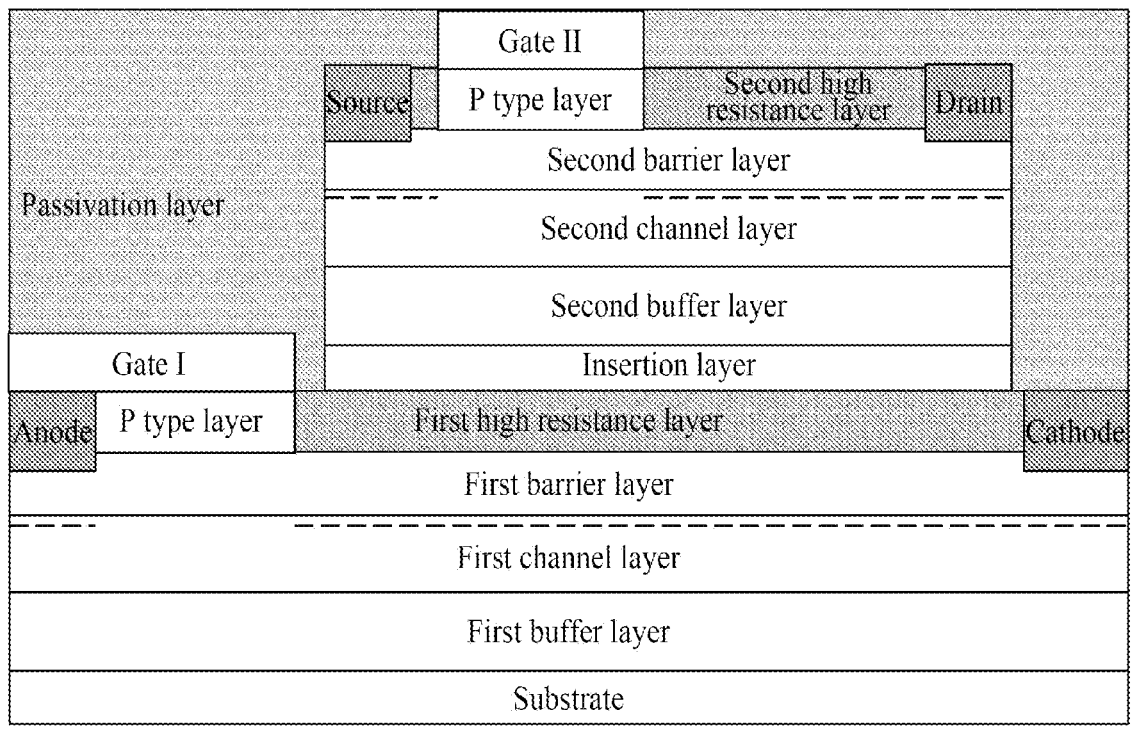
Figure 2G:
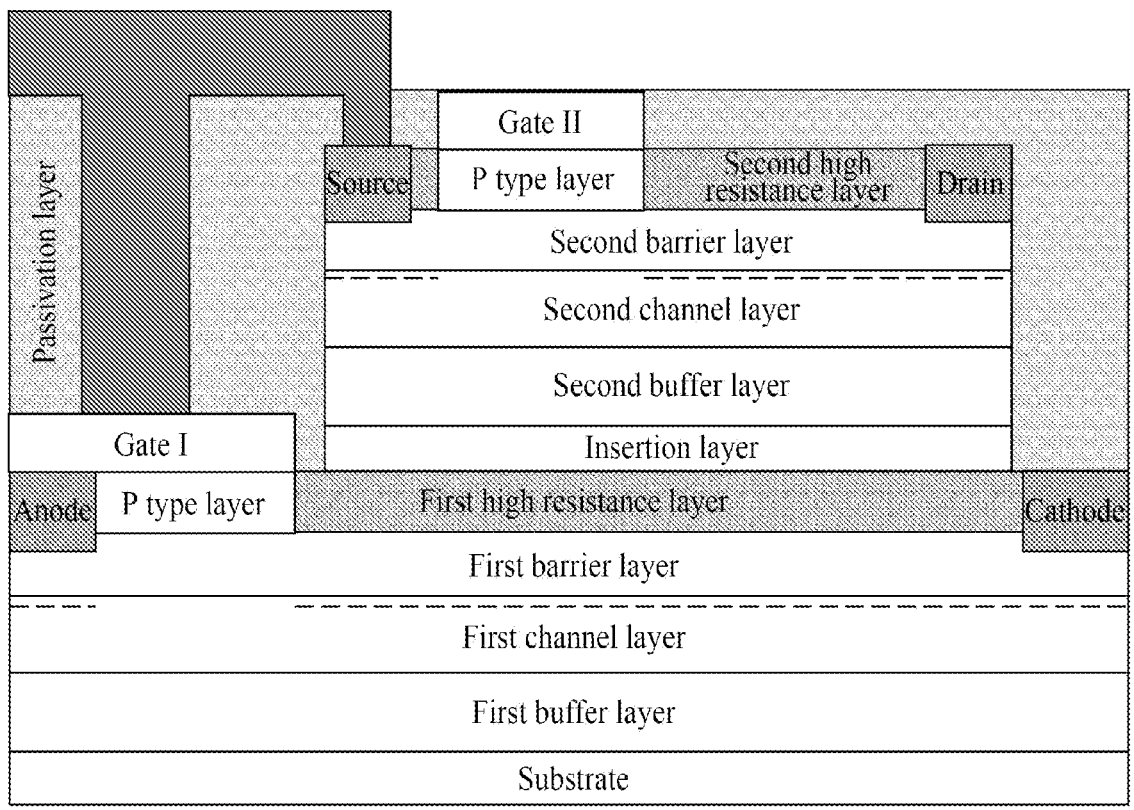

Referring to FIG. 2A-FIG. 2G, a fabricating method of a structure of a group III nitride transistor can comprise the following steps:

1) growing a material structure of a substrate/first buffer layer/first channel layer/first barrier layer/first high resistance layer/second buffer layer/second channel layer/second barrier layer/second high resistance layer as shown in FIG. 2A by using an epitaxy technology such as metal organic compound chemical vapor deposition (MOCVD) or molecular beam epitaxy (MBE) or hydride vapor phase epitaxy (HYPE);

wherein, the substrate can be silicon wafer, sapphire, etc., the material of the first/second channel layer can be GaN or GaAs or the like, the material of the first/second barrier layer can be AlGaN or AlGaAs or the like, a first two-dimensional electron gas is formed between the first channel layer and the first barrier layer, and a second two-dimensional electron gas is formed between the second channel layer and the second barrier layer; the first/second barrier layer has poor conductivity, for example the conductivity of AlGaN is 10 Ω/m or more than 10 Ω/m; the first/second high resistance layer is an inactivated p-type doping layer, the material can be Mg-doped GaN, the first/second high resistance layer has poor conductivity, and the material of the first/second buffer layer can adopt a material known by those skilled in the art;

2) removing a part of second buffer layer/second channel layer/second barrier layer/second high resistance layer of a specified region by using a reactive ion etching technology to expose the first high resistance layer, wherein the structure of the formed material is as shown in FIG. 2B;

3) removing second high resistance layers of a source region and a drain region and first high resistance layers of a cathode region and an anode region, or removing a part or all of first/second barrier layer located in the source region, the drain region/the cathode region and the anode region, and even etching a part of first/second channel layer;

corresponingly fabricating a source, a drain, a cathode and anode in the source region, the drain region, the cathode region and the anode region by using a metal deposition technology such as electron beam evaporation or sputtering, and rapidly annealing, wherein the annealing temperature of annealing is 500-1000° C., and the time of annealing is 0.1-100 min, so that the source, the drain, the cathode and the anode together with materials contacting with them form ohmic contact, and meanwhile the source is electrically connected with the drain via the second two-dimensional electron gas, the cathode is electrically connected with the anode via the first two-dimensional electron gas, and the structure of the device after the electrode is fabricated is as shown in FIG. 2C;

wherein, the thickness of the source/drain/cathode/anode is 10-1000 nm, and the material of the source/drain/cathode/anode can be any one of Ti/Al/Ni/Au, Ti/Al/Ti/Au, Ti/Al/Cr/Au, Ti/Al/Pt/Au, Ti/Al/Mo/Au and Ti/Al/Pd/Au; it is noted that, the anode is electrically connected with the cathode via the first two-dimensional electron gas;

4) depositing a protective layer on the surface of the structure of the device as shown in FIG. 2C by using a film deposition technology such as PECVD, ALD and LPCVD, wherein the thickness of the protective layer is 10-1000 nm, the material of the protective layer can include a combination of any one or more of $SiO_2$, MN and $Si_3N_4$, but is not limited thereto;

subsequently, removing a part of the protective layer by using an etching method such as reactive ion etching or ion beam etching to expose the part of first high resistance layer/second high resistance layer required to be activated;

performing annealing activation of a p-type material on the exposed first high resistance layer/second high resistance layer by using high temperature equipment such as a rapid annealing furnace or MOCVD, so that the corresponding region of the first high resistance layer/second high resistance layer is transformed into a first p-type layer/second p-type layer; wherein the annealing temperature is 300-1000° C., and the structure of the formed device is as shown in FIG. 2D;

5) removing the protective layer, and fabricating a first gate (gate I in the figure) on the first p-type layer and a second gate (gate II in the figure) on the second p-type layer by using a metal deposition technology such as electron beam evaporation or sputtering, and the first gate electrically contacts with the first p-type layer and completely covers the first p-type layer;

wherein, the thickness of the second gate and the first gate is 10-100 nm, the material can be a combination of any one or more than two of Ti, Al, Ni, Au, Cr, Pt, Mo and Pd, generally Ni/Au is used; the structure of the formed device is as shown in FIG. 2E;

6) depositing a passivation layer on the surface of the structure of the device as shown in FIG. 2E by using a film deposition technology such as PECVD, ALD and LPCVD, wherein the thickness of the passivation layer is 10-1000 nm, and the material can be a combination of any one or more of $SiO_2$, AlN, $Al_2O_3$ and $Si_3N_4$, but is not limited thereto; the structure of the formed device is as shown in FIG. 2F;

7) removing the second part of the anode and a part of the passivation layer of the corresponding region of the source by using an etching method such as reactive ion etching or ion beam etching to expose the first gate and the source; then, depositing an interconnected metal electrode by using a metal deposition technology such as electron beam evaporation or sputtering, and electrically connecting the interconnected metal electrode with the first gate and the source respectively;

wherein, the thickness of the interconnected metal electrode is 500-3000 nm, the material includes a combination of any one or more than two of Ti, Al, Ni, Au, Cr, Pt, Mo, Pd and Cu; generally, Cu or Ti/Al is selected, and the structure of the formed device is as shown in FIG. 2G.

Comparative Example 1

Figure 5:
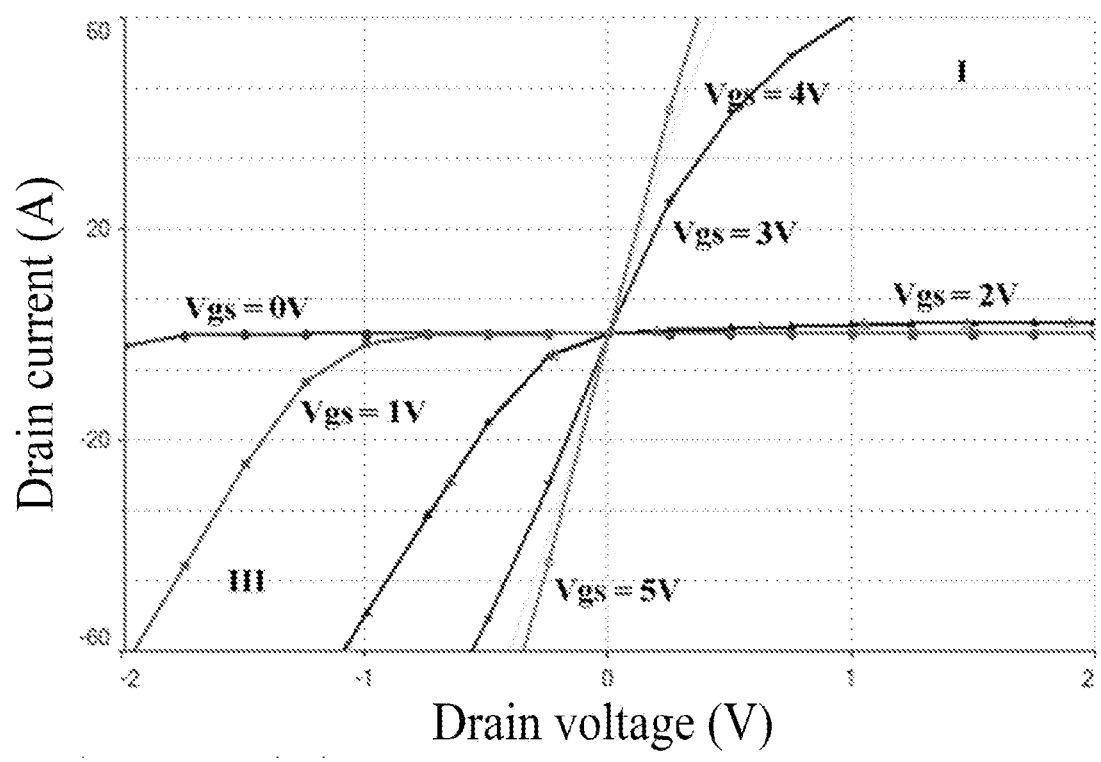
FIG. 5 shows a performance test result of a device in comparative example 1.
Figure 6:
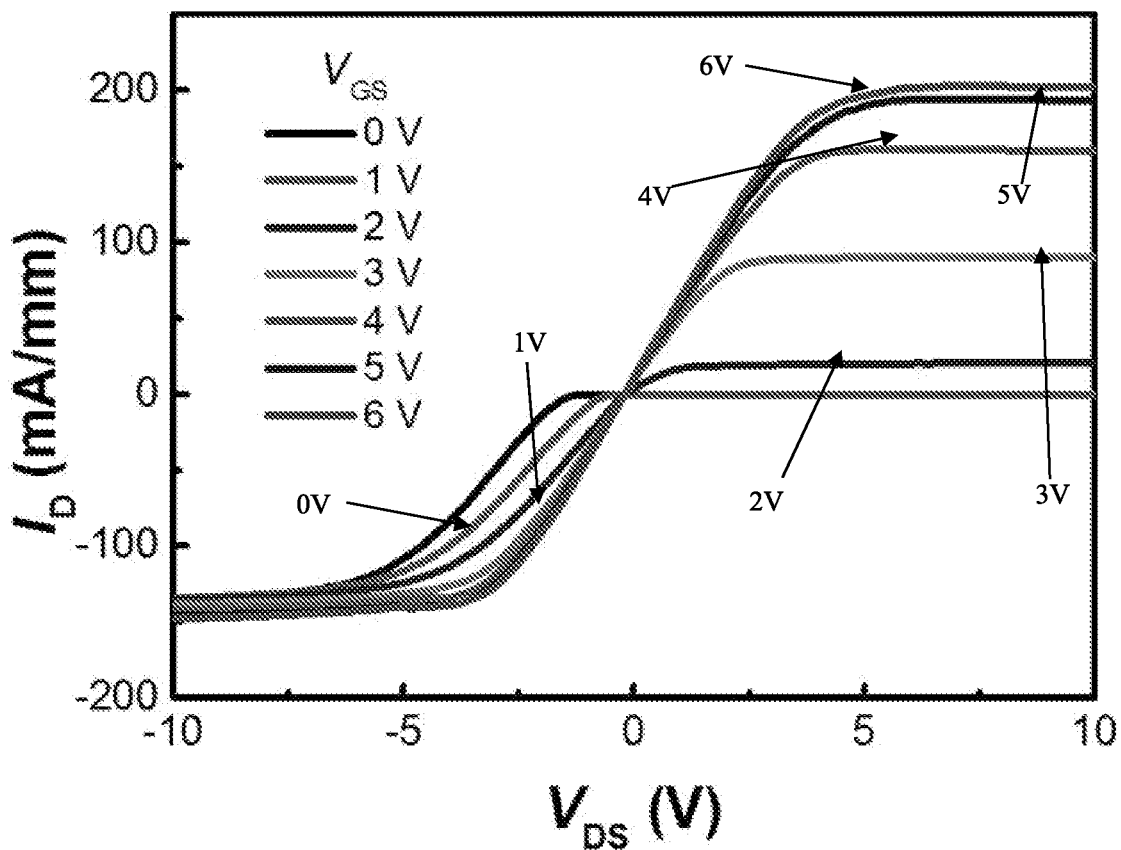
FIG. 6 shows a performance test result of a device in comparative example 2.

Comparative example 1 is a commercial EPC device disclosed in Zhang, H., and R. S. Balog. "Loss analysis during dead time and thermal study of gallium nitride devices." Applied Power Electronics Conference & Exposition IEEE, 2015. The test results of this device are as shown in FIG. 5.

Comparative Example 2

This graph is test data of p-GaN gate transistor made in this research group, and comparative example 2 is a p-GaN gate transistor disclosed in Hao Ronghui. Research on a New Enhanced p-GaN Gate HEMT Power Switch Device [D]. Nanjing University of Science and Technology, 2019.

Example 2

Figure 3:
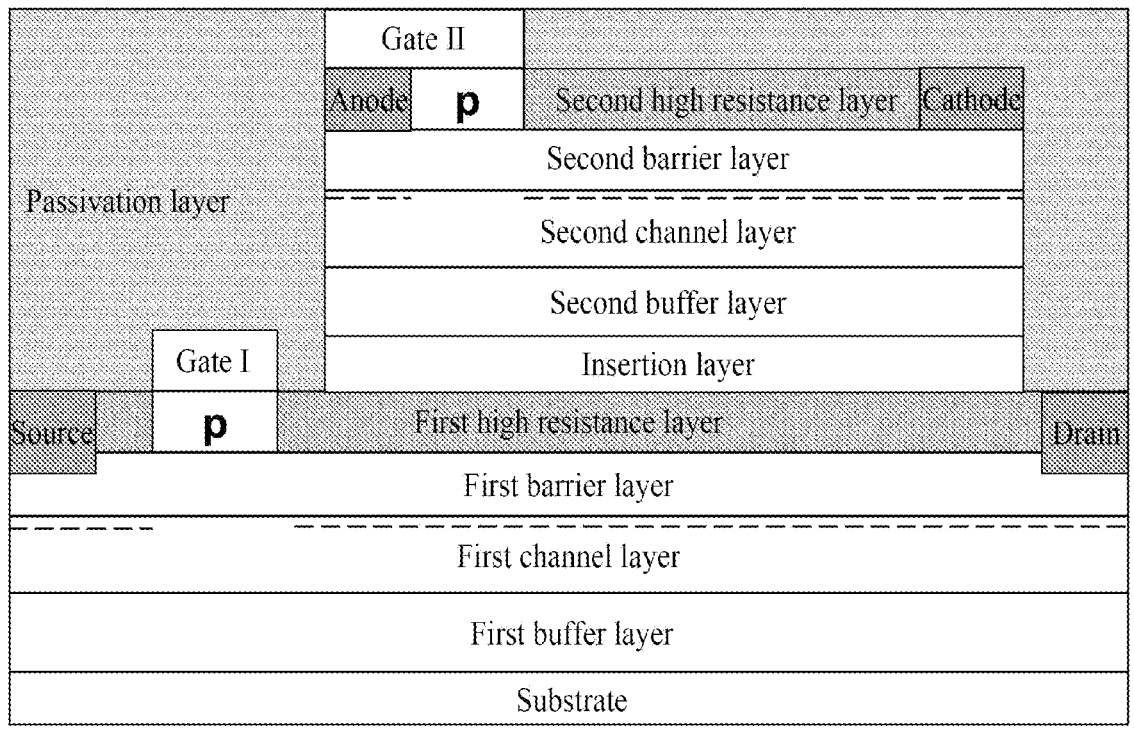
FIG. 3 is a structural diagram of a group III nitride transistor structure capable of reducing a leakage current provided in example 2 of the present application.

The group III nitride transistor structure provided in this example is as shown in FIG. 3. The group III nitride transistor structure provided in this example is different from that in example 1 that the position of a diode portion formed by matching a first heterojunction with an anode, a cathode and a first gate is different from that of a transistor formed by matching a second heterojunction with a source, a drain and a second gate, and the fabricating method of the group III nitride transistor structure provided in this example is basically the same as that in example 1.

Example 3

Figure 4:
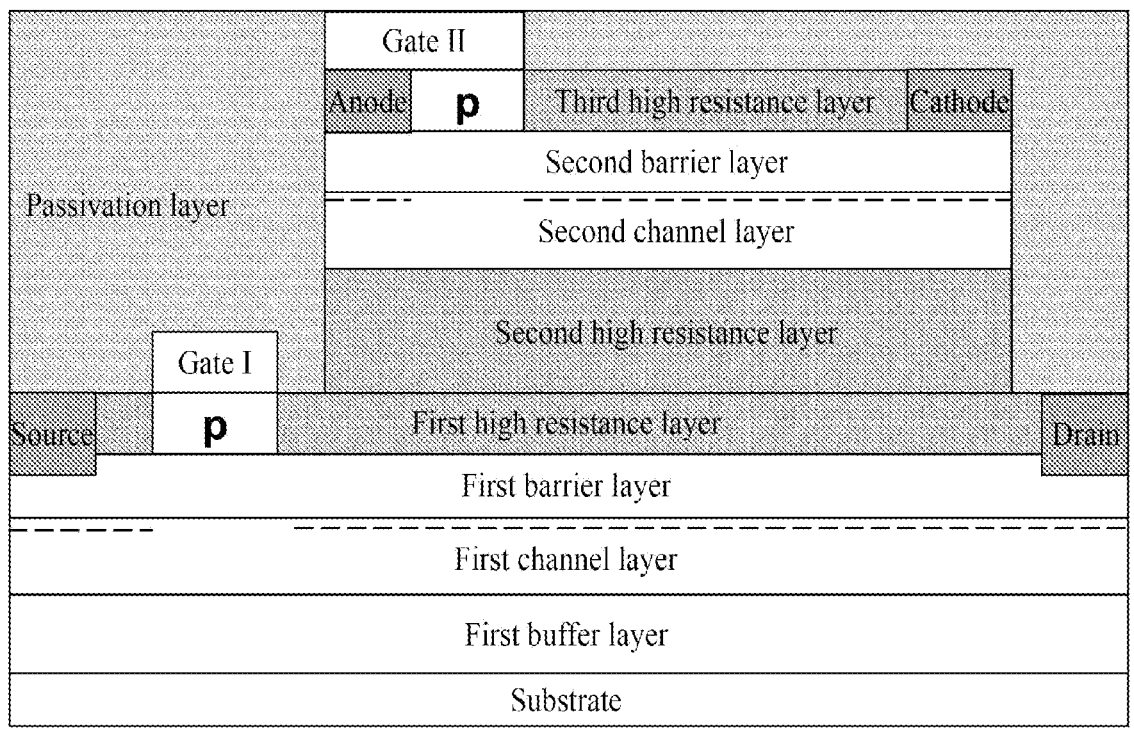
FIG. 4 is a structural diagram of a group III nitride transistor structure capable of reducing a leakage current provided in example 3 of the present application.

The group III nitride transistor structure provided in this example is as shown in FIG. 4, which is different from that in example 1 that a second buffer layer can be replaced with a high resistance material, and the fabricating method of the group III nitride transistor structure provided in this example is basically the same as that in example 1.

Example 4

Figure 7:
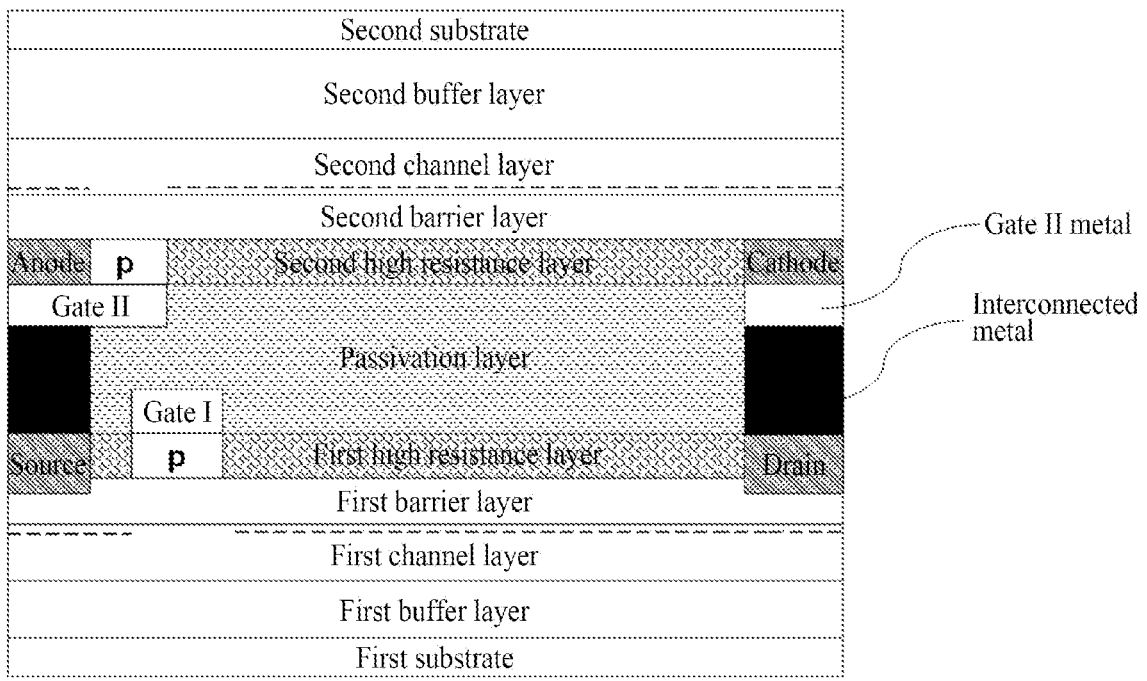
FIG. 7 is a structural diagram of a group III nitride transistor structure capable of reducing a leakage current provided in example 4 of the present application.

The group III nitride transistor structure provided in this example is as shown in FIG. 7. The group III nitride transistor structure includes a first buffer layer, a first channel layer, a first barrier layer, a first p-type layer and a first high resistance layer, a passivation layer, a second p-type layer, and a second high resistance layer, a second barrier layer, a second channel layer, a second buffer and a second substrate, which are successively laminated on a first substrate, the first channel layer and the first barrier layer are matched to form a first heterojunction, and a first two-dimensional electron gas (2 DEG) is formed between the first channel layer and the first barrier layer, the second channel layer is matched with the second barrier layer to form a second heterojunction, and a second two-dimensional electron gas (2 DEG) is formed between the second channel layer and the second barrier layer;

the second barrier layer is provided with anodes (i.e., the above-mentioned first electrode, the same below) and cathodes (i.e., the above-mentioned second electrode, the same below) at intervals, the cathode is electrically connected with the anode via the second 2 DEG, the second p-type layer is also provided with a second gate (gate II shown in the figure, the same below), the second gate is electrically connected with the anode and completely covers the second p-type layer, the second gate electrically contacts with the second p-type layer, and the second p-type layer is also electrically isolated from the cathode via the second high resistance layer;

the first barrier layer is provided with sources and drains at intervals, the source is electrically connected with the drain via the first 2 DEG, the first p-type layer is provided with a first gate (gate I shown in the figure), and the first p-type layer is also electrically isolated from the source and the drain via the first high resistance layer; and via the interconnected metal, the second gate is also electrically connected with the source, and the cathode is also electrically connected with the drain.

It is noted that, the second heterojunction is matched with the anode, the cathode and the second gate to form the diode, and the first heterojunction is matched with the source, the drain and the first gate to form the transistor.

Example 5

Figure 8:
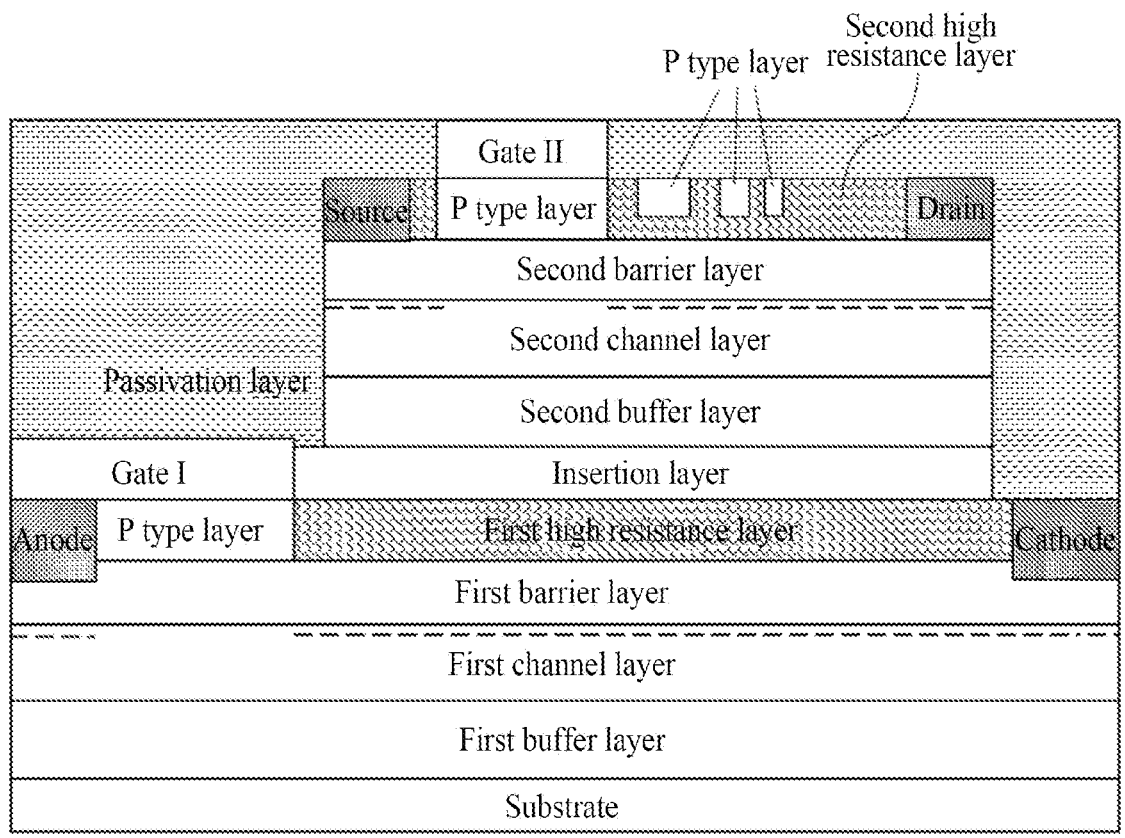
FIG. 8 is a structural diagram of a group III nitride transistor structure capable of reducing a leakage current provided in example 5 of the present application.

The group III nitride transistor structure provided in this example is as shown in FIG. 8, which is basically the same as that in example 1. Their difference is that a plurality of p-type layers are arranged at intervals in the first high resistance layer or second high resistance layer in the diode or transistor located on the upper layer, the material of the plurality of p-type layers can be the same as that of the first or second p-type layer in the transistor or diode where the plurality of p-type layers are located, and the volume and space of the plurality of p-type layers are both gradually reduced in a direction far away from the first gate or second gate.

For example, in this example, the p-type layer is p-GaN, wherein the space between a plurality of p-GaN is passivated by H plasma, and the diffusion of the H plasmas conforms to Gaussian distribution:

$$C(x) = \frac{Q(w)}{2\sqrt{\pi L^2}} e^{-x^2/(4L^2)},$$

wherein, C represents concentration, x represents the size of the space, Q represents the content of H, and L represents the width of diffusion.

Figure 9:
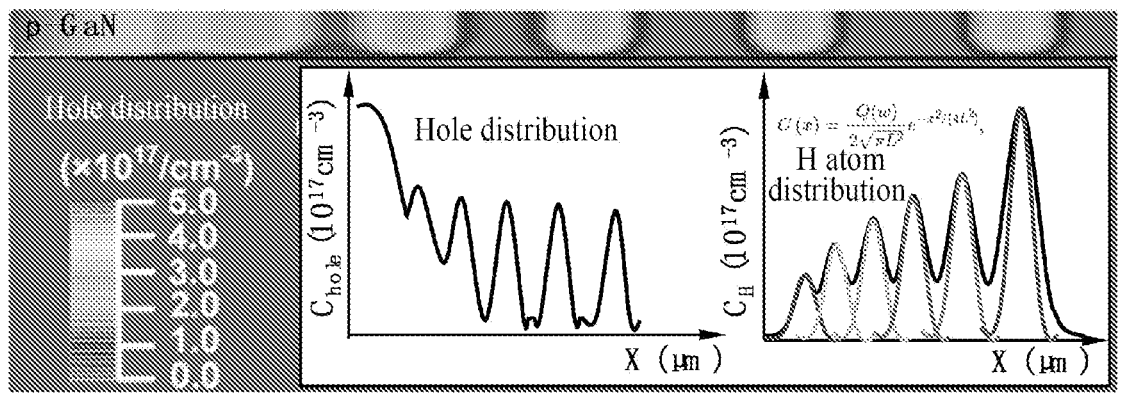
FIG. 9 shows a corresponding curve between hole distribution/H atom distribution and p-GaN spacing in a p-type layer.
Figure 10:
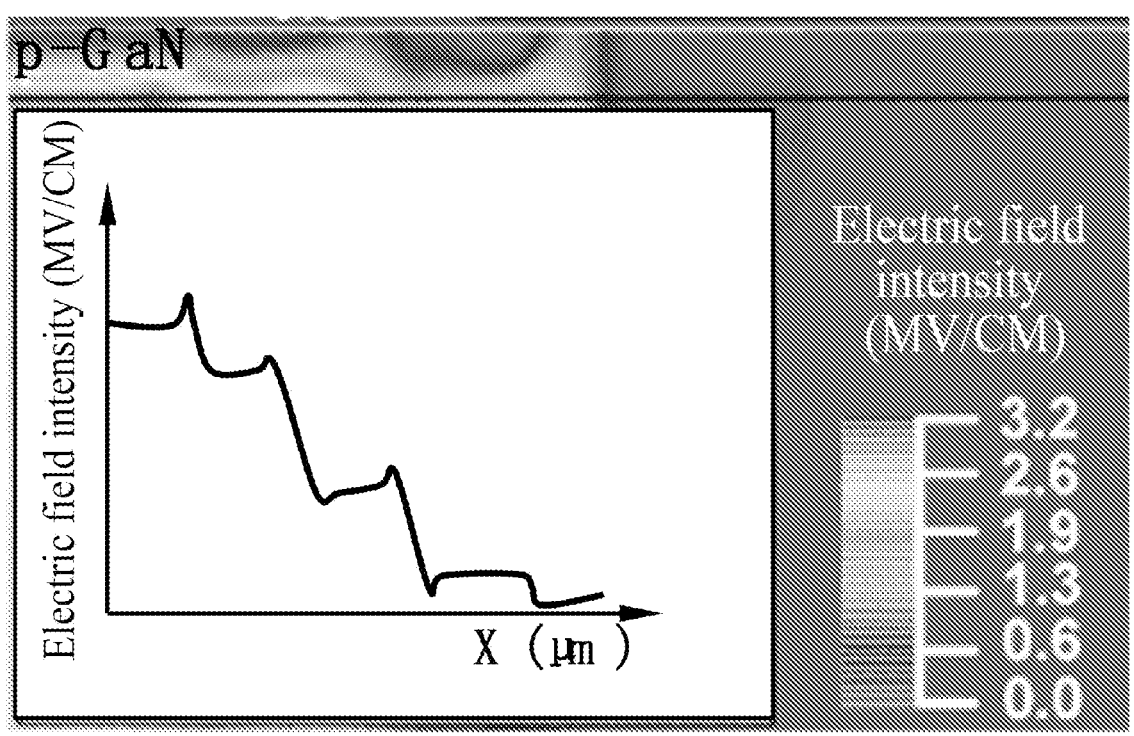
FIG. 10 shows a corresponding curve between electric field intensity and p-GaN space in a p-type layer.

Through researches, the inventor of this case find that if the space between the plurality of p-GaN is gradually reduced in a direction far away from the first gate or the second gate, the concentration gradient can be generated in the plurality of p-GaNs by diffusion. As can be seen from FIG. 9, arrangement of the plurality of p-GaN at specific intervals can extremely well adjust the concentration distribution of p-GaN. As can be seen from FIG. 10, in cases that the plurality of p-GaN are arranged at specific intervals and the concentration is distributed in a specified manner, the electric field intensity of the group III nitride transistor is also gradually decreased, but platform characteristics are retained, so that the group III nitride transistor structure can withstand high voltage.

In the group III nitride transistor structure provided by the embodiment of the present application, the diode and the triode are integrated in a direction vertical to the substrate, so that the area of the wafer occupied by the group III nitride transistor is smaller, which is conducive to miniaturization application of the device; furthermore, the entire structure of the device has the characteristics of direct growth and process compatibility, thereby effectively reducing the complexity and fabricating cost of the device; and the structure of the group III nitride transistor provided by the embodiment of the present application can effectively reduce the leakage current of the device and decrease power consumption, thereby improving the reliability and stability of the device.

What is claimed is:

1. A group III nitride transistor structure capable of reducing a leakage current, comprising:

a first heterojunction and a second heterojunction which are laminated, wherein the first heterojunction is electrically isolated from the second heterojunction via a high resistance material or insertion layer;

a first electrode, a second electrode and a first gate which are matched with the first heterojunction, wherein the first electrode is electrically connected with the second electrode via a first two-dimensional electron gas in the first heterojunction, and a third semiconductor is arranged between the first gate and the first heterojunction, wherein the third semiconductor can exhaust a part of the first two-dimensional electron gas located below the third semiconductor, and the first gate is also electrically connected with the first electrode;

a source, a drain and a second gate which are matched with the second heterojunction, wherein the source is electrically connected with the drain via a second two-dimensional electron gas in the second heterojunction, and the source and the drain are also electrically connected with the first gate and the second electrode respectively, a sixth semiconductor is arranged between the second gate and the second heterojunction, wherein the sixth semiconductor can exhaust a part of the second two-dimensional electron gas located below the sixth semiconductor.

2. The group III nitride transistor structure capable of reducing the leakage current according to claim 1, wherein the group III nitride transistor structure comprises a first semiconductor, a second semiconductor, a high resistance material layer or an insertion layer, a fourth semiconductor and a fifth semiconductor which were successively grown in a set direction;

or, the group III nitride transistor structure comprises a fourth semiconductor, a fifth semiconductor, a high resistance material layer or an insertion layer, a first semiconductor and a second semiconductor which were successively grown in a set direction;

or, the group III nitride transistor structure comprises a first semiconductor, a second semiconductor, a high resistance material layer, an insertion layer, a fourth semiconductor and a fifth semiconductor which were successively grown in a set direction;

or, the group III nitride transistor structure comprises a fourth semiconductor, a fifth semiconductor, a high resistance material layer, an insertion layer, a first semiconductor and a second semiconductor which were successively grown in a set direction;

wherein the first semiconductor is matched with the second semiconductor to form the first heterojunction, and the fourth semiconductor is matched with the fifth semiconductor to form the second heterojunction.

3. The group III nitride transistor structure capable of reducing the leakage current according to claim 2, wherein the high resistance material layer was formed by transforming a first region of a continuous third semiconductor layer, and the third semiconductor was distributed in a second region of the third semiconductor layer;

or, the third semiconductor was formed by transforming a second region of a continuous high resistance material layer, and the high resistance material was distributed in a first region of the high resistance material layer.

4. The group III nitride transistor structure capable of reducing the leakage current according to claim 3, wherein the third semiconductor is a p-type semiconductor; a material of the third semiconductor comprises a p-type wide band gap semiconductor; more the p-type wide band gap semiconductor comprises a p-type group III nitride; more the p-type group III nitride comprises p-type GaN, p-type AlGaN, p-type InGaN or p-type InN; the p-type semiconductor comprises p-type polycrystalline silicon, p-type non-crystalline silicon, a p-type oxide, p-type diamond or a p-type semiconductor polymer; more the third semiconductor comprises a plurality of strip-shaped p-type semiconductors arranged at intervals, and the plurality of strip-shaped p-type semiconductors are distributed in an array;

a doping concentration of the third semiconductor is $10^{16}$ cm$^{-3}$-$10^{20}$ cm$^{-3}$; a thickness of the third semiconductor is 10 nm-500 nm;

the high resistance material comprises high resistance GaN, high resistance AlGaN, high resistance Ga$_2$O$_3$, high resistance InGaN or high resistance InN.

5. The group III nitride transistor structure capable of reducing the leakage current according to claim 2, wherein the third semiconductor is a p-type semiconductor; a material of the third semiconductor comprises a p-type wide band gap semiconductor; the p-type wide band gap semiconductor comprises a p-type group III nitride; the p-type group III nitride comprises p-type GaN, p-type AlGaN, p-type InGaN or p-type InN; the p-type semiconductor comprises p-type polycrystalline silicon, p-type non-crystalline silicon, a p-type oxide, p-type diamond or a p-type semiconductor polymer; the third semiconductor comprises a plurality of strip-shaped p-type semiconductors arranged at intervals, and the plurality of strip-shaped p-type semiconductors are distributed in an array;

a doping concentration of the third semiconductor is $10^{16}$ cm$^{-3}$-$10^{20}$ cm$^{-3}$; a thickness of the third semiconductor is 10 nm-500 nm;

the high resistance material comprises high resistance GaN, high resistance AlGaN, high resistance Ga$_2$O$_3$, high resistance InGaN or high resistance InN.

6. The group III nitride transistor structure capable of reducing the leakage current according to claim 2, wherein the high resistance material layer is formed by transforming a third region of a continuous sixth semiconductor layer, and the sixth semiconductor is distributed in a fourth region of the sixth semiconductor layer;

or, the sixth semiconductor is formed by transforming a fourth region of a continuous high resistance material layer, and the high resistance material is distributed in a third region of the high resistance material layer.

7. The group III nitride transistor structure capable of reducing the leakage current according to claim 6, wherein the sixth semiconductor is the p-type semiconductor; a material of the sixth semiconductor comprises a p-type wide band gap semiconductor; the p-type wide band gap semiconductor comprises a p-type group III nitride; the p-type group III nitride comprises p-type GaN, p-type AlGaN, p-type InGaN or p-type InN; the p-type semiconductor comprises p-type polycrystalline silicon, p-type non-crystalline silicon, a p-type oxide, p-type diamond or a p-type semiconductor polymer;

the high resistance material comprises high resistance GaN, high resistance AlGaN, high resistance Ga$_2$O$_3$, high resistance InGaN or high resistance InN.

8. The group III nitride transistor structure capable of reducing the leakage current according to claim 2, wherein the high resistance material layer is distributed between the third semiconductor and the second electrode, and the third semiconductor is also electrically isolated from the second electrode via the high resistance material;

or, the high resistance material layer is distributed between the sixth semiconductor and the source as well as the drain, and the sixth semiconductor is also electrically isolated from the source and the drain via the high resistance material;

or, the insertion layer comprises any one of a metal layer, a dielectric layer and a two-dimensional material layer;

the metal layer comprises a single-layer metal layer or a laminated multi-layer metal layer, and a material of the metal layer comprises any one of Mo, Mg and Al; a thickness of the metal layer is 2 nm-10 μm;

a material of the dielectric layer comprises any one of AlN, BN, AlBN, AlPN, BCN, high resistance AlGaN and high resistance GaN; a thickness of the dielectric layer is 0.5 nm-1 μm;

a material of the two-dimensional material layer comprises any one of BN, graphene, fluorinated graphene, graphene oxide and black phosphorus; a thickness of the two-dimensional material layer is 0.5 nm-500 nm.

9. The group III nitride transistor structure capable of reducing the leakage current according to claim 2, wherein the second heterojunction is also provided with an insulating dielectric layer, and the source and the drain are arranged on the insulating dielectric layer;

a thickness of the insulating dielectric layer is 1 nm-1000 nm; a material of the insulating dielectric layer comprises at least one of SiO$_2$, AlN and Si$_3$N$_4$;

the sixth semiconductor is also provided with a two-dimensional material, and the source and the drain are arranged on the two-dimensional material;

the third semiconductor is provided with the two-dimensional material;

a layer number of the two-dimensional material is 1-100 layers; the two-dimensional material is a single kind of two-dimensional material or two-dimensional material heterojunction; the two-dimensional material comprises at least one of graphene, MoS$_2$ and WS$_2$.

10. The group III nitride transistor structure capable of reducing the leakage current according to claim 2, wherein a seventh semiconductor is also arranged between the first semiconductor and the second semiconductor or between the fourth semiconductor and the fifth semiconductor;

materials of the first semiconductor, the second semiconductor, the fourth semiconductor and the fifth semiconductor are all selected from group III-V compounds; the materials of the first semiconductor and the fourth semiconductor comprise GaN or GaAs; the materials of the second semiconductor and the fifth semiconductor comprise AlGaN or AlGaAs; the material of the seventh semiconductor comprises AlN.

11. A fabricating method of a group III nitride transistor structure capable of reducing a leakage current, comprising:
fabricating a first heterojunction, a high resistance material or insertion layer and a second heterojunction which are laminated in a set direction, wherein the first heterojunction is electrically isolated from the second heterojunction via the high resistance material or insertion layer;
fabricating a first electrode, a second electrode, a first gate and a third semiconductor which are matched with the first heterojunction, wherein the first electrode is electrically connected with the second electrode through a first two-dimensional electron gas in the first heterojunction, the third semiconductor is arranged between the first gate and the first heterojunction, the first gate is also electrically connected with the first electrode, wherein the third semiconductor can exhaust a part of the first two-dimensional electron gas located below the third semiconductor;
fabricating a source, a drain, a second gate and a sixth semiconductor which are matched with the second heterojunction, wherein the source is electrically connected with the drain through a second two-dimensional electron gas in the second heterojunction, the sixth semiconductor is arranged between the second gate and the second heterojunction, wherein the sixth semiconductor can exhaust a part of the second two-dimensional electron gas located below the sixth semiconductor; and
electrically connecting the first gate with the source, and electrically connecting the second electrode with the drain.

12. The fabricating method according to claim 11, specifically comprising:
successively growing a first semiconductor, a second semiconductor, a high resistance material layer or an insertion layer, a fourth semiconductor and a fifth semiconductor which are laminated in a set direction,
or, successively growing a fourth semiconductor, a fifth semiconductor, a high resistance material layer or an insertion layer, a first semiconductor and a second semiconductor which are laminated in a set direction,
or, successively growing a first semiconductor, a second semiconductor, a high resistance material layer, an insertion layer, a fourth semiconductor and a fifth semiconductor which are laminated in a set direction,
or, successively growing a fourth semiconductor, a fifth semiconductor, a high resistance material layer, an insertion layer, a first semiconductor and a second semiconductor which are laminated in a set direction,
wherein the first semiconductor is matched with the second semiconductor to form the first heterojunction, and the fourth semiconductor is matched with the fifth semiconductor to form the second heterojunction.

13. The fabricating method according to claim 12, specifically comprising: forming a continuous third semiconductor layer, comprising a first region and a second region, on the second semiconductor, and transforming the first region to form the high resistance material layer;
or, forming a continuous high resistance material layer, comprising a first region and a second region, on the second semiconductor, and transforming the second region to form the third semiconductor.

14. The fabricating method according to claim 13, wherein the method for transformation comprises at least one selected from the group consisting of H ion injection, H plasma treatment, H doping and annealing, N ion injection, F ion injection, Ar ion injection, Fe ion injection, O plasma treatment and thermal oxidization;
or, the fabricating method further comprises: patterning the third semiconductor, thereby processing the third semiconductor into a strip-shaped array structure;
or, the fabricating method further comprises:
performing epitaxial growth of the third semiconductor and the high resistance material layer in a selected region of the second semiconductor;
or, performing epitaxial growth of the sixth semiconductor and the high resistance material layer in a selected region of the fifth semiconductor;
the fabricating method further comprises: forming an insertion layer on the high resistance material layer, and then fabricating the first heterojuncton or the second heterojunction on the insertion layer;
or, the insertion layer comprises any one of a metal layer, a dielectric layer and a two-dimensional material layer;
the metal layer comprises a single-layer metal layer or a laminated multi-layer metal layer, and a material of the metal layer comprises any one of Mo, Mg and Al; a thickness of the metal layer is 2 nm-10 μm;
a material of the dielectric layer comprises any one of AlN, BN, AlBN, AlPN, BCN, high resistance AlGaN and high resistance GaN; a thickness of the dielectric layer is 0.5 nm-1 μm;
a material of the two-dimensional material layer comprises any one of BN, graphene, fluorinated graphene, graphene oxide and black phosphorus; a thickness of the two-dimensional material layer is 0.5 nm-500 nm.

15. The fabricating method according to claim 12, specifically comprising: forming a continuous sixth semiconductor layer, comprising comprises a third region and a fourth region, on the fifth semiconductor, and transforming the third region to form the high resistance material layer;
or, forming a continuous high resistance material layer, comprising a third region and a fourth region, on the fifth semiconductor, and transforming the fourth region to form the sixth semiconductor.

16. The fabricating method according to claim 15, wherein the method for transformation comprises at least one selected from the group consisting of H ion injection, H plasma treatment, H doping and annealing, N ion injection, F ion injection, Ar ion injection, Fe ion injection, O plasma treatment and thermal oxidization;
or, the fabricating method further comprises: patterning the third semiconductor, thereby processing the third semiconductor into a strip-shaped array structure;
or, the fabricating method further comprises:
performing epitaxial growth of the third semiconductor and the high resistance material layer in a selected region of the second semiconductor;
or, performing epitaxial growth of the sixth semiconductor and the high resistance material layer in a selected region of the fifth semiconductor;
the fabricating method further comprises: forming an insertion layer on the high resistance material layer, and then fabricating the first heterojunciton or the second heterojunction on the insertion layer;
or, the insertion layer comprises any one of a metal layer, a dielectric layer and a two-dimensional material layer;
the metal layer comprises a single-layer metal layer or a laminated multi-layer metal layer, and a material of the metal layer comprises any one of Mo, Mg and Al; a thickness of the metal layer is 2 nm-10 μm;

a material of the dielectric layer comprises any one of AlN, BN, AlBN, AlPN, BCN, high resistance AlGaN and high resistance GaN; a thickness of the dielectric layer is 0.5 nm-1 μm;

a material of the two-dimensional material layer comprises any one of BN, graphene, fluorinated graphene, graphene oxide and black phosphorus; a thickness of the two-dimensional material layer is 0.5 nm-500 nm.

17. The fabricating method according to claim 12, wherein the third semiconductor is also electrically isolated from the second electrode via the high resistance material, or, the sixth semiconductor is also electrically isolated from the source and the drain via the high resistance material;

or, the third semiconductor and the sixth semiconductor are p-type semiconductors; materials of the third semiconductor and the sixth semiconductor comprise p-type wide band gap semiconductors; the p-type wide band gap semiconductor comprises a p-type group III nitride; the p-type group III nitride comprises p-type GaN, p-type AlGaN, p-type InGaN or p-type InN; the p-type semiconductor comprises p-type polycrystalline silicon, p-type non-crystalline silicon, a p-type oxide, p-type diamond or a p-type semiconductor polymer;

the first high resistance material and the second high resistance comprise high resistance GaN, high resistance AlGaN, high resistance $Ga_2O_3$, high resistance InGaN or high resistance InN.

* * * * *